United States Patent [19]

Macnak et al.

[11] Patent Number: 4,862,516
[45] Date of Patent: Aug. 29, 1989

[54] SYSTEM FOR AUTOMATICALLY TUNING THE ANTENNA OF A MINIATURE PORTABLE COMMUNICATIONS DEVICE

[75] Inventors: Philip P. Macnak, West Palm Beach; James S. Irwin, Ft. Lauderdale; Walter L. Davis, Coral Springs, all of Fla.

[73] Assignee: Motorola, Inc., Schaumburg, Ill.

[21] Appl. No.: 121,824

[22] PCT Filed: Jan. 2, 1987

[86] PCT No.: PCT/US87/00002
§ 371 Date: Feb. 27, 1987
§ 102(e) Date: Feb. 27, 1987

[87] PCT Pub. No.: WO88/05214
PCT Pub. Date: Jul. 14, 1988

[51] Int. Cl.$^4$ .............................................. H04B 1/18
[52] U.S. Cl. ..................................... 455/193; 455/195; 343/718
[58] Field of Search .............. 455/193, 195, 200, 340, 455/343, 351, 184, 187, 191; 343/718, 788

[56] References Cited
U.S. PATENT DOCUMENTS

| | | | |
|---|---|---|---|
| 4,008,437 | 2/1977 | Sakauchi et al. | 455/195 |
| 4,053,838 | 10/1977 | Amaya | 455/195 |
| 4,285,065 | 8/1981 | Priniski | 455/200 |
| 4,336,534 | 6/1982 | Kumagai | 340/253 |
| 4,450,588 | 2/1964 | Röhrich et al. | 455/195 |

FOREIGN PATENT DOCUMENTS

| | | |
|---|---|---|
| 0148389 | 7/1985 | European Pat. Off. . |
| 0184606 | 6/1986 | European Pat. Off. . |
| 3115291 | 11/1982 | Fed. Rep. of Germany . |
| 56-110331 | 9/1981 | Japan . |

Primary Examiner—Robert L. Griffin
Assistant Examiner—Frank M. Scutch, III
Attorney, Agent, or Firm—Philip P. Macnak; Vincent B. Ingrassia

[57] ABSTRACT

An antenna tuning apparatus for a portable communications device which includes a means of adapting the device to be worn on the body is described. The device consists of an antenna, tuning means and a receiver for receiving transmitted signals including a tuning mode signal. A decoder initiates antenna tuning when the tuning mode signal is detected. A tuning controller enables a carrier detection circuit to determine the magnitude of the received signals, and generates a tuning control signal supplied to a D/A converter to effect tuning of the antenna by monitoring the variations in the magnitude of the received signals.

36 Claims, 6 Drawing Sheets

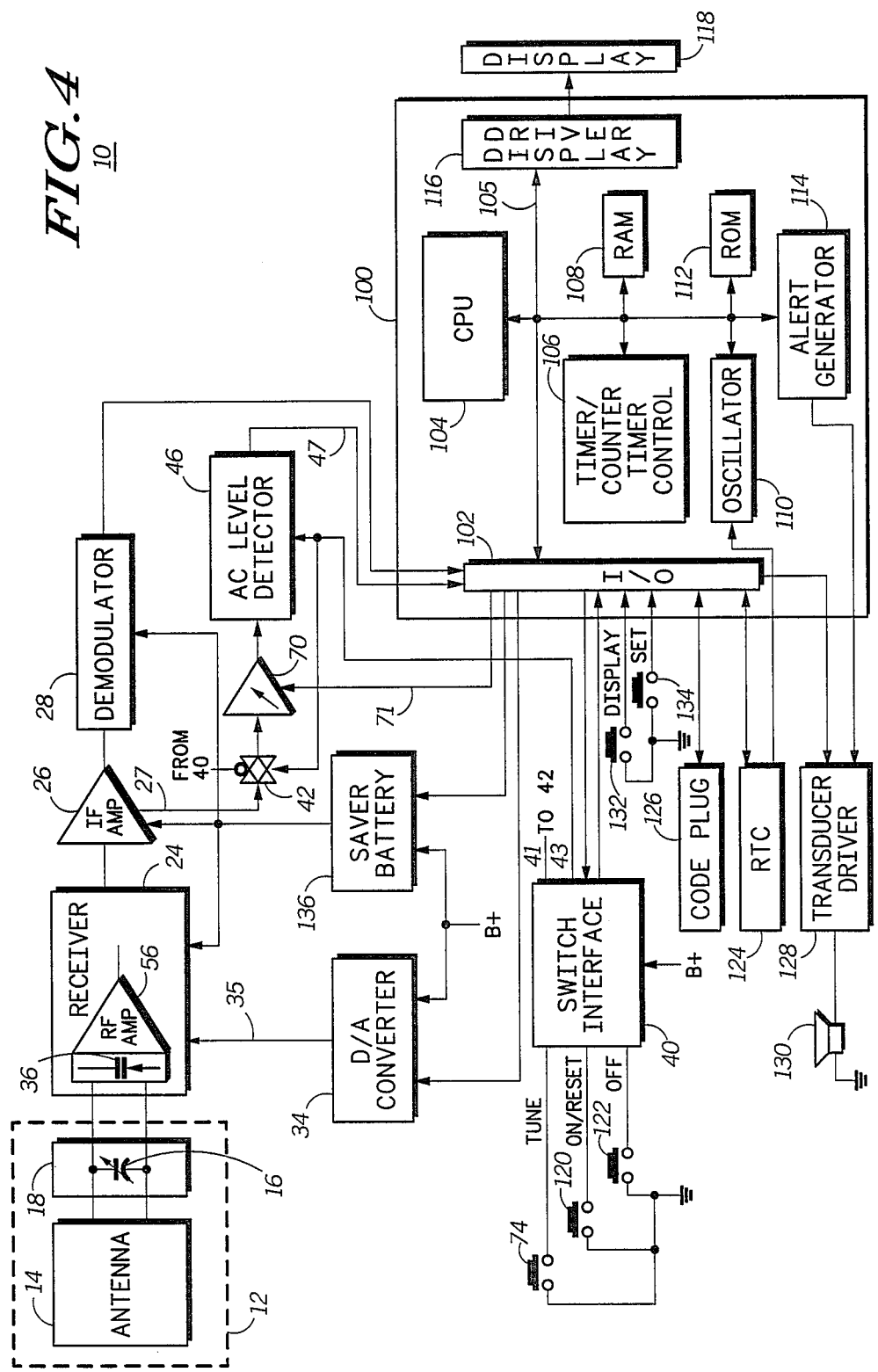

GSC SIGNALLING SYSTEM

POCSAG SIGNALLING SYSTEM
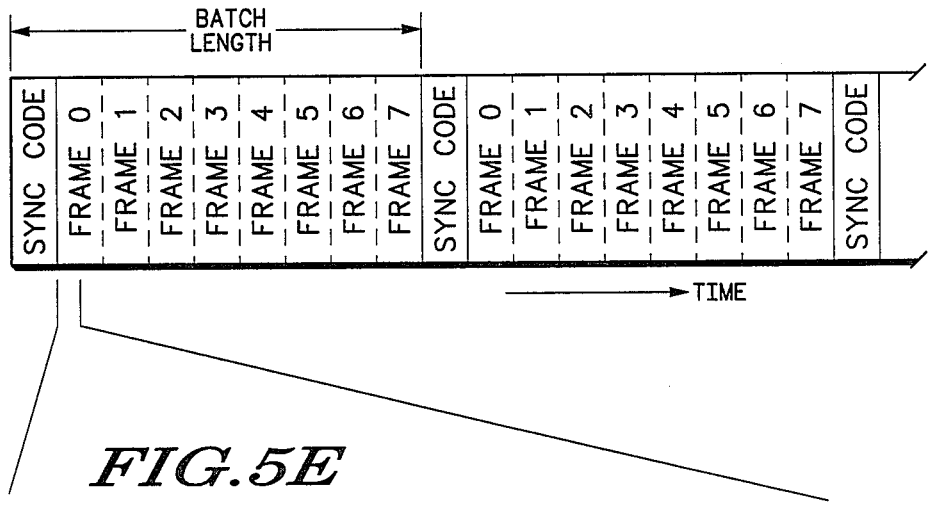

SYSTEM FOR AUTOMATICALLY TUNING THE ANTENNA OF A MINIATURE PORTABLE COMMUNICATIONS DEVICE

FIELD OF THE INVENTION

This invention relates to the field of antennas for miniature portable communications devices. More particularly, the invention relates to a system and apparatus for automatically tuning an antenna located in the attachment device adapting the device to be worn on the body, such as in a wristband, bracelet, or necklace, while the device is being worn.

BACKGROUND OF THE INVENTION

There are many miniature portable electronic devices available today adapted to be worn on the body and providing a variety of features and functions to the wearer. Examples of such devices include watches, calculators, miniature broadcast receivers, and even miniaturized personal body function monitoring devices. These miniature portable electronic devices are available in a variety of forms, such as wrist worn devices, as watches, and devices which are clipped or hung on the body, as pendants or broaches. Many of these devices include receiver functions requiring an antenna to be incorporated in the design of the device, thereby providing a miniature portable communications device. Various methods of incorporating the antenna into these prior art miniature portable communications devices have been proposed. The antenna has variously been located in the wristband of the device, externally connected to the case of the device, or included within the case of the device. In each instance, tuning of the prior art device antennas has been achieved by tuning elements located in the case of the device which can only be accessed by opening the case of the device.

In addition to having to enter the case for access to modify the antenna tuning elements, prior art devices also require access into the case to access the test or metering point providing the indication that the antenna is being tuned. Without access to the metering point, tuning of the antenna and subsequently the receiver itself, is impossible.

Most antennas, including those provided in prior art devices are generally detuned, when they are brought into close proximity to the body. Thus, prior art tuning methods which are internally performed and require access into the device case, do not optimize the "on the body" antenna sensitivity. Optimum antenna performance can only be achieved when the device is tuned in situ, on the person who is to wear the device.

However, even when the antennas of such devices are tuned on the body, many factors will affect whether the antenna will remain tuned. If the attachment device is a wristband, the antenna tuning can be affected by how tightly or how loosely the band is tightened on the wrist. Should the band loosen, the tuning will change. Devices with wristbands are often removed, such as at night. Again, significant changes in the antenna tuning would occur. If the antenna is configured in a necklace the same problems with tuning, and maintaining the tuning when the device is worn, as opposed to when the device is removed occurs. These and other problems associated with the prior art designs are overcome by the use of the invention described in detail herein.

SUMMARY OF THE INVENTION

It is an object of the present invention to provide a means of tuning the antenna of a miniature portable communications device that may be accomplished while the device is being worn.

It is a further object of the present invention to provide a means of tuning the antenna of a miniature portable communications device which draws no power from the battery when the device is not being tuned.

It is a further object of the present invention to provide a means of tuning the antenna of a miniature portable communications device which can be automatically selected by means of an RF communications channel.

It is a further object of the present invention to provide a means of tuning the antenna of a miniature portable communications device which can automatically compensate for detuning of the antenna.

In general, an antenna tuning apparatus is provided for a portable communications device which includes means for adapting the device to be worn on the body. The device includes an antenna for intercepting transmitted signals, tuning means for tuning the antenna, and a receiver for receiving transmitted signals, including a tuning mode signal, monitor signal and to recover the tuning mode signal. A decoder, responsive to the tuning mode signal generates an output to initiate antenna tuning when the tuning mode signal is detected. A tuning controller which is responsive to the decoder output enables a carrier detection circuit which determines the magnitude of the received signals. The tuning controller also generates a tuning control signal supplied to a converter circuit to generate a tuning voltage which is supplied to the antenna tuning circuit to effect tuning of the antenna.

In another embodiment, an antenna tuning apparatus is provided for a portable communications device which includes means for adapting the device to be worn on the body. The device includes an antenna for intercepting transmitted signals, tuning means for tuning the antenna, and a receiver for receiving transmitted signals, including a tuning mode signal, to derive a carrier monitor signal and to also recover the tuning mode signal. A microcomputer is programmed to perform decoding and tuning controller functions. As a decoder, the microcomputer is responsive to the tuning mode signal and generates an output to initiate antenna tuning when the tuning mode signal is received. As the tuning controller, the microcomputer enables a carrier detection circuit which determines the magnitude of the received signals. The microcomputer tuning controller also generates a tuning control signal which is supplied to a converter circuit to generate a tuning voltage which is supplied to the antenna tuning circuit to effect tuning of the antenna.

These and other objects and advantages of the present invention will become apparent to those skilled in the art upon consideration of the following description and accompanying drawings of the invention.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

FIG. 4 is an electrical schematic diagram of the present invention employing a mirocomputer.

FIGS. 5A-5F are pictorial diagrams of the coding used the select the automatic tuning mode of the present invention.

DESCRIPTION OF THE PREFERRED EMBODIMENT

Figure 1:
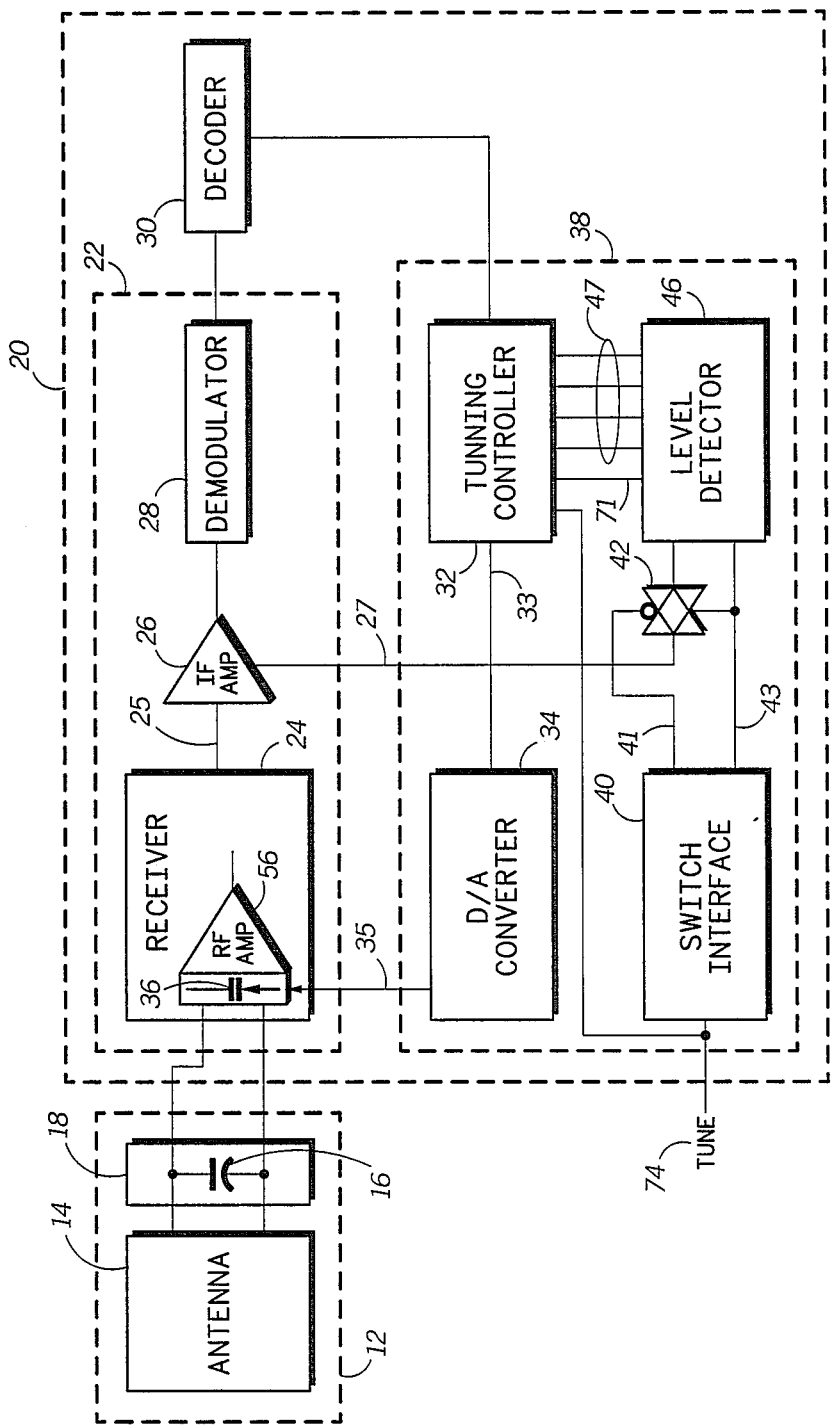
FIG. 1 is a functional block diagram of the preferred embodiment of the present invention.

Reference is now directed to the drawings, and in particular to FIG. 1, which represents a functional block diagram for a device 10 constructed in accordance with the present invention. Device 10 represents one of the many forms of miniature portable communications devices which may be constructed in accordance with the present invention and which incorporates the antenna to be advantageously located in the attachment portion adapted for wearing the device on the body. One example for device 10 is a device capable of being worn on the wrist, such as a pager-watch, consisting of a wristband 12 and a housing or case 20. Within the attachment portion, which in this case is a wristband 12, there is located an antenna 14, and an element to generally tune the antenna, shown as a capacitor 16. The tuning element, or capacitor 16, is shown to be contained in a section 18 of wristband 12, and provides a fixed coarse tuning function, not the fine tuning to antenna 14. It will be appreciated by those skilled in the art that tuning element 16 may not always be required.

Within case 20, as shown in FIG. 1, is located a communications receiver 22. Communications receiver 22 is used to receive transmitted signals, such as system synchronization signals, selective call signals, as well as unmodulated carrier signals, all of which may be used for tuning the antenna. Within communications receiver 22 is shown a receiver portion 24 consisting of an RF amplifier 56 and oscillator and mixer circuits which are not shown, the function of which are each well known to those skilled in the art. The input of RF amplifier 56 is coupled to a varactor tuning diode 36 providing the fine tuning adjustment, which is also coupled to antenna 14 and coarse tuning element 16, the combination providing for reception of a transmitted RF carrier signal in a manner well known to one skilled in the art, and providing at the output an intermediate, or IF signal 25. The IF signal 25 is amplified by IF amplifier 26 to a level sufficient to drive a demodulator 28, coupled to the IF amplifier 26 output.

As will be appreciated by one skilled in the art, the level of the signal provided at the output of the IF amplifier 26 is in limiting in the case of an FM communications receiver and such a limited signal cannot be used to monitor tuning of the antenna and receiver sections. A signal which varies linearly as the antenna and receiver sections are tuned is needed to monitor the tuning process, and is obtained by taking an intermediate tuning, or meter point, output 27 from the IF amplifier which has not been amplified as extensively as the signal at the output of the IF amplifier.

Demodulator 28 demodulates the transmitted signals to provide a stream of binary information at the output which is provided to decoder 30. Decoder 30 compares the received information with predetermined information stored within the device. When the received information matches the stored predetermined information, the decoder provides a detection signal at its output in a manner well known to those skilled in the art. It will be appreciated by those skilled in the art that decoder are generally capable of responding to multiple selective call signals, thus generating multiple detection signals used to indicate either multiple alerting functions, indicated by some form of sensible alert, such as an audible alert, or alerting functions and control signals, which when decoded indicate further information is required to be received before completing the decoding sequence. In the case of the present invention, a predetermined tuning mode signal is transmitted, which when detected, provides an output from decoder 30 which is coupled to a tuning indicator circuit 38, and in particular to tuning controller 32, to initiate an automatic antenna tuning sequence to be described in detail later. It will be appreciated by those skilled in the art, that the tuning mode signal may be a part of the system synchronization signal, an independant selective call signal decodable by an entire group of devices, or a secondary signal decoded after the devices individual selective call address has been decoded, all of which are to be described in detail later.

Tuning controller 32 monitors the tuning process by means of level detector circuit 46, and controls the tuning process by means of D/A converter 34 which is connected to one output of tuning controller 32, after having been enabled to do so by the generation of a detection signal by decoder 30 as previously described.

As further shown in FIG. 1, a second output from tuning controller 32 which connects to the input of switch interface 40 and is used to select the tuning mode as will be described later. Switch 44 (not shown in detail in FIG. 1) which is located in case 20 can also manually initiate the tuning mode when it is actuated. The outputs 41 and 43 of switch interface 40 couple to an electronic switch 42 which isolates the meter point signal 27 from level detector circuit 46 when the tuning mode is not selected. The second output 43 of switch interface 40 also couples to level detector circuit 46 for controlling the power supplied to level detector circuit 46 as will be described in detail later.

Level detector circuit 46 provides output signals 47 which correspond to the magnitude of the meter point signal 27 which will be described in detail later. These output or magnitude signals 47 are coupled to tuning controller 32 and provide an indication of the results of tuning antenna 14. In response to the magnitude signals 47, tuning controller 32 generates an output signal 33 used to control the tuning which is coupled to D/A converter 34. The output 35 of D/A converter 34 couples to varactor tuning diode 36 providing a voltage output corresponding to that which is required to change the capacitance of tuning diode 36, thereby tuning antenna 14.

Figure 2:
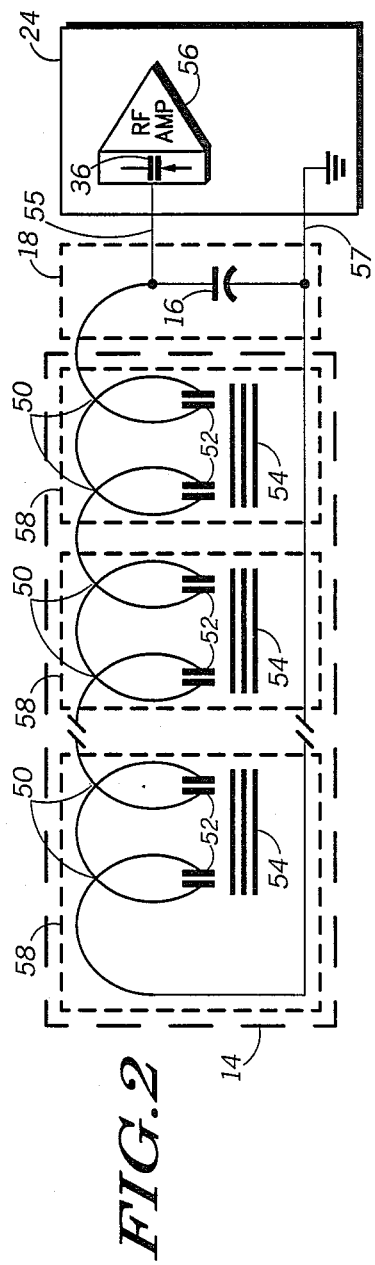
FIG. 2 is an electrical schematic diagram of a wristband antenna, constructed in accordance with the present invention.

Reference is now directed to FIG. 2 which shows the preferred embodiment of antenna 14 constructed in the attachment portion of the device, such as a wristband, suitable for use with a miniature portable communications device. Only a brief description of antenna 14 will be given, as a detailed description of its construction and operation may be found in U.S. Pat. No. 3,946,397 to Irwin, entitled "Inductor Antenna Arrangement with Integral Series Resonating Capacitors" which is assigned to the assignee of the present invention, and which is hereby incorporated for reference.

In the preferred embodiment of antenna 14 shown in FIG. 2 and constructed for wrist attachment, antenna 14 is composed of a number of sections or links 58 fashioned using a ferromagnetic material core 54, such as ferrite. Two turns 50 of a conductive material, such as flat copper wire, are wound on core 54, the windings being interspersed with two fixed capacitors 52 which are generally of equal value. The links 58 are interconnected on a flexible substrate to form a multi-turn loop antenna which connects to coarse tuning element 16. A protective cover, such as silicon rubber or other suitable material, may be molded over the links 58 to provide environmental protection. Link 18 which protects and conceals coarse tuning element 16 may be molded as part of the wristband. One output 55 from antenna 14 is coupled into case 20 to the input of RF amplifier 56 which is also coupled to varactor tuning diode 36. The second output 57 is coupled into case 20 and provides the signal ground in a fashion also well known to one skilled in the art.

While FIG. 2 has been described as showing an antenna that may be specifically constructed into a wristband which is normally used to provide attachment to the body, it will be appreciated that other body attachment devices, such as bracelets, necklaces, chains, and belts may be constructed in the manner previously described for the dual purpose of body attachment and antenna system.

Figure 3:
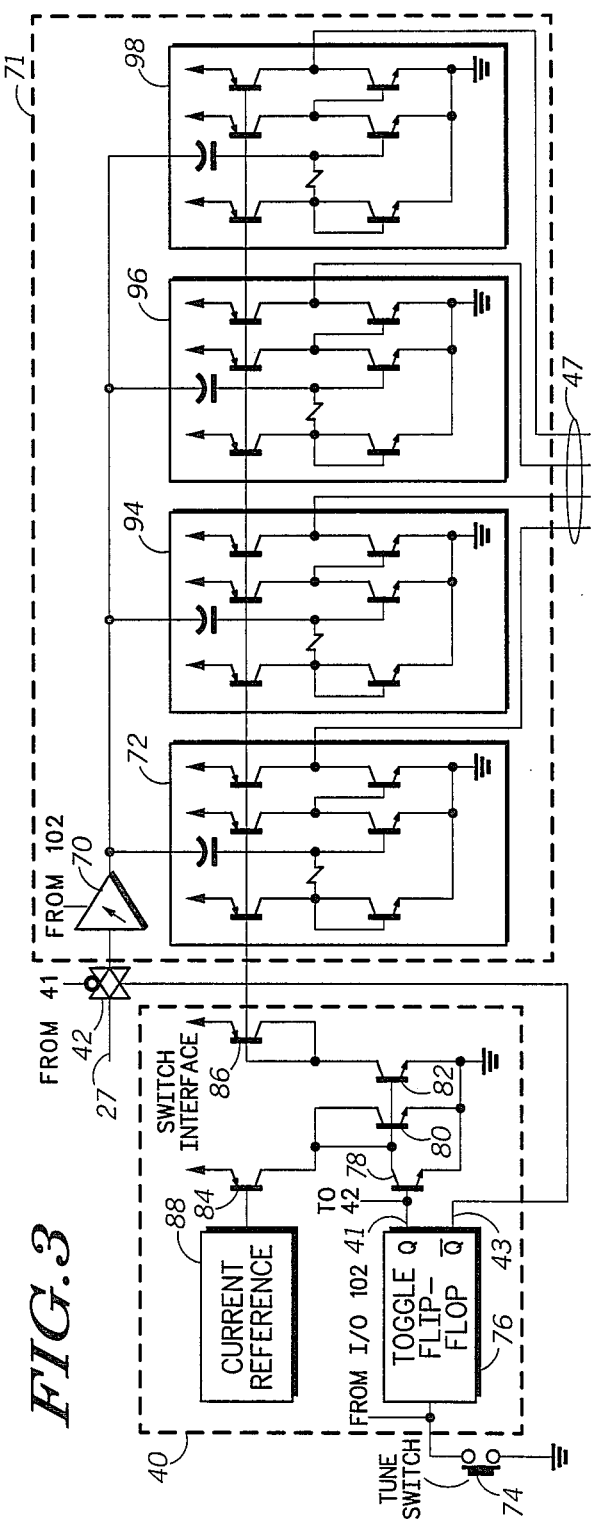
FIG. 3 is a more detailed electrical schematic diagram of the preferred embodiment of the present invention.

Reference is now directed to FIG. 3 which shows a more detailed electrical diagram for switch interface 40 and level detector 46 of the preferred embodiment of the present invention. Switch interface circuit 40 is shown to include a toggle flip flop 76, a current reference 88, and five transistors 78, 80, 82, 84, and 86. Current reference 88, together with transistor 84, which acts as a current mirror, provides a fixed output current at the collector of transistor 84 in a manner well known to one skilled in the art. The collector of transistor 84 connects to the base and collector of diode-connected transistor 80 and to the collector of transistor 78. Assuming transistor 78 to be switched off, the collector current of transistor 84 passes through diode-connected transistor 80. The base of transistor 82 is connected to the collector-base of diode-connected transistor 80, forming a current mirror with transistor 80. Thus, transistor 82 collector current is determined by the current delivered by transistor 84 passing through diode-connected transistor 80. The collector of transistor 82 is connected to the collector and base of diode-connected transistor 86, forming current mirrors with the PNP transistors located in level or peak detectors 72, 94, 96 and 98 thus providing the bias for their operation. The operation of the peak detector circuits 72, 94, 96 and 98 is best understood by referring to U.S. Pat. No. 4,017,748 to Davis, entitled "Monolithic AC Level Detector" which is assigned to the assignee of the present invention, the disclosure of which is hereby incorporated for reference. Thus, when transistor 78 is switched off, power is provided to peak detector circuits 72, 94, 96 and 98 which are then operational.

Each of the individual peak detector circuits 72, 94, 96 and 98 is set to different threshold levels, such as a 2 dB difference between peak detector circuits 72 and 94, a 1 dB difference between peak detector circuits 94 and 96 and a 2 dB difference between peak detector circuits 96 and 98. In this manner, the results of tuning are digitized and provided to tuning controller circuit 32.

A switch 74, as previously described, is coupled to the input of toggle flip flop 76, providing manual operation of tuning indicator circuit 38. Switch 74 alternately sets and resets toggle flip flop 76 each time switch 74 is actuated. When toggle flip flop 76 is reset, Q output terminal 41 is low. The Q output terminal 41 couples to the base of transistor 78, consequently when Q output terminal 41 is low, transistor 78 output will be high or off, activating peak detector circuits 72, 94, 96 and 98 as previously described. When toggle flip-flop 76 is set, Q output terminal 41 goes high, turning transistor 78 on which sinks transistor 84 collector current, removing the bias to the current mirror formed by transistors 80 and 82, thereby turning off peak detector circuits 72, 94, 96 and 98. An input is also shown coming from I/O 102 of microcomputer 100, to be described in detail later, which is used to control the automatic selection of tuning indicator circuit 38 to provide automatic antenna 14 tuning.

The Q-bar output terminal 43 of toggle flip-flop 76 is connected to one of the control inputs of CMOS transmission gate 42. The other control inputs connects to Q output terminal 41. When toggle flip-flop 76 is reset, Q-bar output terminal 43 is high and Q output terminal 41 is low, switching CMOS transmission gate 42 into a low impedance state, thereby coupling the meter point signal 27 to the input of amplifier 70. When toggle flip-flop 76 is set, Q-bar output terminal 43 is low and Q output terminal 41 is high, switching CMOS transmission gate 42 into a high impedance state, thereby isolating the meter point signal 27 from the input of amplifier 70.

Amplifier 70 provides a variable gain, controlled by tuning controller 32 through output 71, to boost the meter point signal 27 by an amount which is sufficient to allow operation of level detector 46, as the meter point signal 27 output can vary considerably depending upon the signal strength of the received carrier signal. The output of amplifier 70 is coupled to the inputs of peak detector circuits 72, 94, 96 and 98, and when the inputs exceed the threshold values to which the individual peak detector circuits 72, 94, 96 and 98 are set, the level detector outputs 47 corresponding to those peak detector circuits which thresholds have been exceeded will go high, providing in this case a four level digitized signal representing the signal strength of the received carrier signal.

It will be appreciated by those skilled in the art that the received signal strength can vary widely. It is therefore important that sufficient signal quality exists in order that the antenna be tuned properly. Thus, in areas with low signal strength, it may be undesirable to attempt to tune the antenna. The gain of amplifier 70 is set to accommodate the range of signal strengths suitable for tuning the antenna. If a gain is required which is greater than can be provided by amplifier 70, the device will not tune the antenna. Other factors, such as noise, signal fading and others, can also affect the ability to tune the antenna. These factors are also compensated for by amplifier 70.

Reference is now directed to FIG. 4 which shows the embodiment of the present invention utilizing a microcomputer 100 to provide control of the automatic tuning function described, as well as to provide such additional functions as those of a watch. Antenna 14 along with tuning element 16 is constructed in the attachment portion of the device, such as the wristband 12 in a manner previously described. Antenna 14 is coupled to the input of RF amplifier 56, as previously described. Also at the input of RF amp 56 is a varactor tuning diode 36 which is used to fine tune antenna 14 in the automatic tuning mode. Meter point signal 27 is derived as previously described and is coupled to the input of MOS switch 42. MOS switch 42 output is coupled to the input of amplifier 70. Since the received transmitted carrier signal is highly variable, the gain of amplifier 70 must be controlled by mircocomputer 100 through I/O port 102 in a manner to be described shortly. The output of amplifier 70 couples to level detector 46, which provides multiple outputs to microcomputer 100 through I/O port 102 indicating the magnitude of the received carrier signal. As will be appreciated by one skilled in the art, the greater the number of steps encoded by level detector 46, the greater the resolution to which the microcomputer will be able to tune antenna 14. Assuming a four level operation as previously described, microcomputer 100 is able to determined if the gain of amplifier 70 must be increased by sensing all outputs from level detector 46 being high as previously described. When all outputs from level detector 46 are low, microcomputer 100 recognizes the gain of amplifier 70 is too high and must be reduced. Thus, microcomputer 100 will attempt to adjust the gain of amplifier 70 to the mid range of level detector 46. If the gain cannot be adjusted to the mid range point, microcomputer 100 will exit the tuning mode until the next time it is initiated by the system. A D/A converter 34 couples to I/O 102 providing the voltage necessary to adjust the capacitance of varactor diode 36 required for tuning antenna 14 under microcomputer control.

Microcomputer 100 consists of a microprocessor 104, coupled through buss 105 to I/O 102, timer/counter 106, oscillator 110, alert generator 114, ROM 112, RAM 108 and display driver 116. ROM 112 stores the firmware directing the operation of microprocessor 104. RAM 108 is used for temporary storage of information required in performing the routines stored in ROM 112. Oscillator 110 provides the clock output to microprocessor 104. Timer/counter 106 is used by microprocessor 104 to provide controllable time intervals required by microprocessor 104. Alert generator 110 is controllable by microprocessor 104 to provide alerting signals when alerting functions are required, such as when a page has been received Display driver 116 is used to provide the proper drive signals to display 118, such as when time is displayed. When alerting signals are generated, a transducer driver circuit 128 is provided, coupled to alert generator circuit 114 and I/O 102 for control of the audible delivery of the alerting signal. The alerting signal is audibly delivered by means of transducer 130. Watch functions are provided by real time clock 124 in a manner well known to one skilled in the art. "Display" switch 132 and "set" switch 134 couple to microcomputer 100 I/O buss 102 providing control of setting and displaying the time information. "Tune" switch 74 is coupled to switch interface 40 providing manual control of tuning in a manner as previously described. "Off" switch 122 and "On/reset" switch 120 also couple to switch interface 40 providing control of power to receiver 22 in a manner well known in the art.

When receiver 22 is powered, microprocessor 104 intermittantly controls power to receiver 22 through battery saver circuit 136 in a manner well known to one skilled in the art. Microprocessor 104 controls battery saver 136 through I/O 102. As previously described, device 10 includes a pager function. Microcomputer 100 performs the functions of decoding transmitted selective call signalling information which is received by receiver 22 in a manner well known to one skilled in the art. The unique address to which the personal communications device, such as a pager-watch 10, will respond to is contained in code plug 126 which is coupled to I/O 102.

Figure 5A:
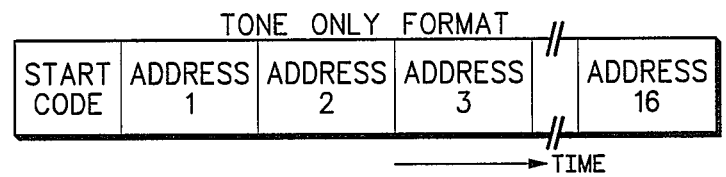
Figure 5B:
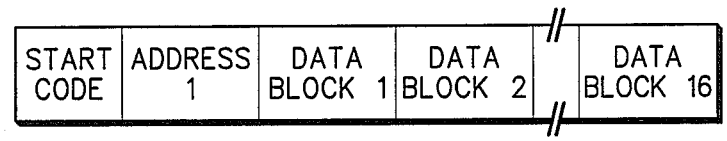
Figure 5C:
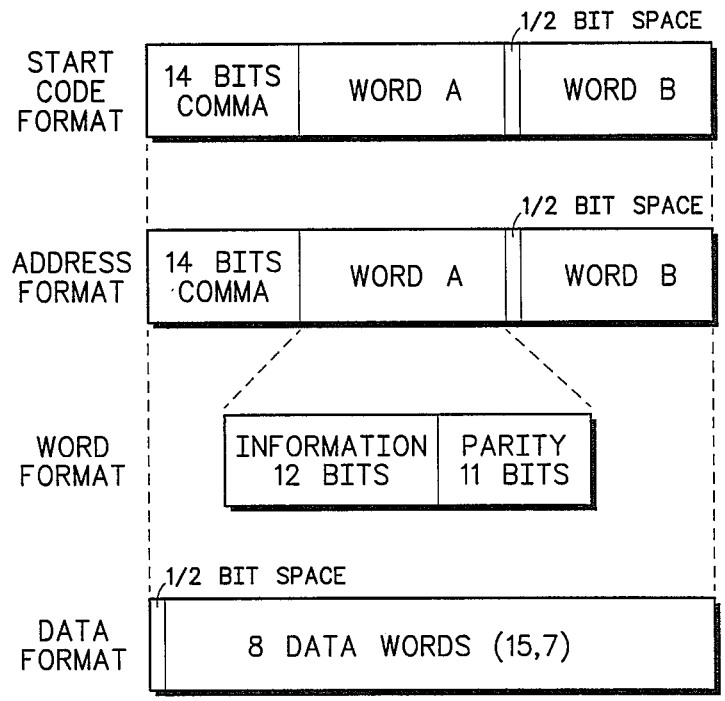

Reference is now directed to FIG. 5 which shows several forms of coding formats suitable for use with the preferred embodiment of the present invention. There are numerous coding formats that are available today with which to implement the present invention. Two widely used coding formats that are well known to those skilled in the art are the Golay Sequential Code (GSC), shown in FIGS. 5A through 5C, and the POCSAG code, shown in FIGS. 5D through 5F. The Golay Sequential Code supports various styles of pagers, such as tone only pagers using a signalling format as shown in FIG. 5A, and tone and data pagers using a tone and data format as shown in FIG. 5B. Both formats begin the transmission by sending a start code SC, followed by addresses only, in the case of the tone only format, and addresses and data blocks, in the case of the tone and data format. As shown in FIG. 5C, the structure of the start code SC and the addresses are identical, the start code SC being a reserved address word specifically for that purpose. In the case of the present invention, the tuning mode signal or code is also a reserved address transmitted in the manner shown. Depending upon how the device is set up to decode the tuning mode code, the tuning mode code may be decodable by a large group or population of devices in addition to the normal addresses, or the tuning mode code may follow a standard address and be decoded only by the device to which the standard address is directed. A detailed description of the Golay Sequential Code may be found in U.S. Pat. No. 4,424,514 issued to Fennell et al, entitled "Decoder for Transmitted Activation Code" which is assigned to the assignee of the present invention, and which is hereby incorporated for reference herein.

As in the Golay Sequential Code, the POCSAG coding format utilizes address and data structures shown in FIGS. 5E and 5F respectively. POCSAG addresses and data are transmitted in batches as shown in FIG. 5D, each batch starting with a sync code followed by eight address and data frames, each frame consisting of multiple address and data blocks. As with the Golay Sequential Code, the tuning mode code may be a unique sync code word which is periodically transmitted to which the device will respond to initiate tuning, or the tuning mode code may be a unique address word transmitted in the appropriate frame to which one or more devices can respond, or the tuning mode code may be a unique address decodable only after the device has decoded its assigned addresses. The details of the POCSAG coding format are well known to those skilled in the art.

Figure 6:
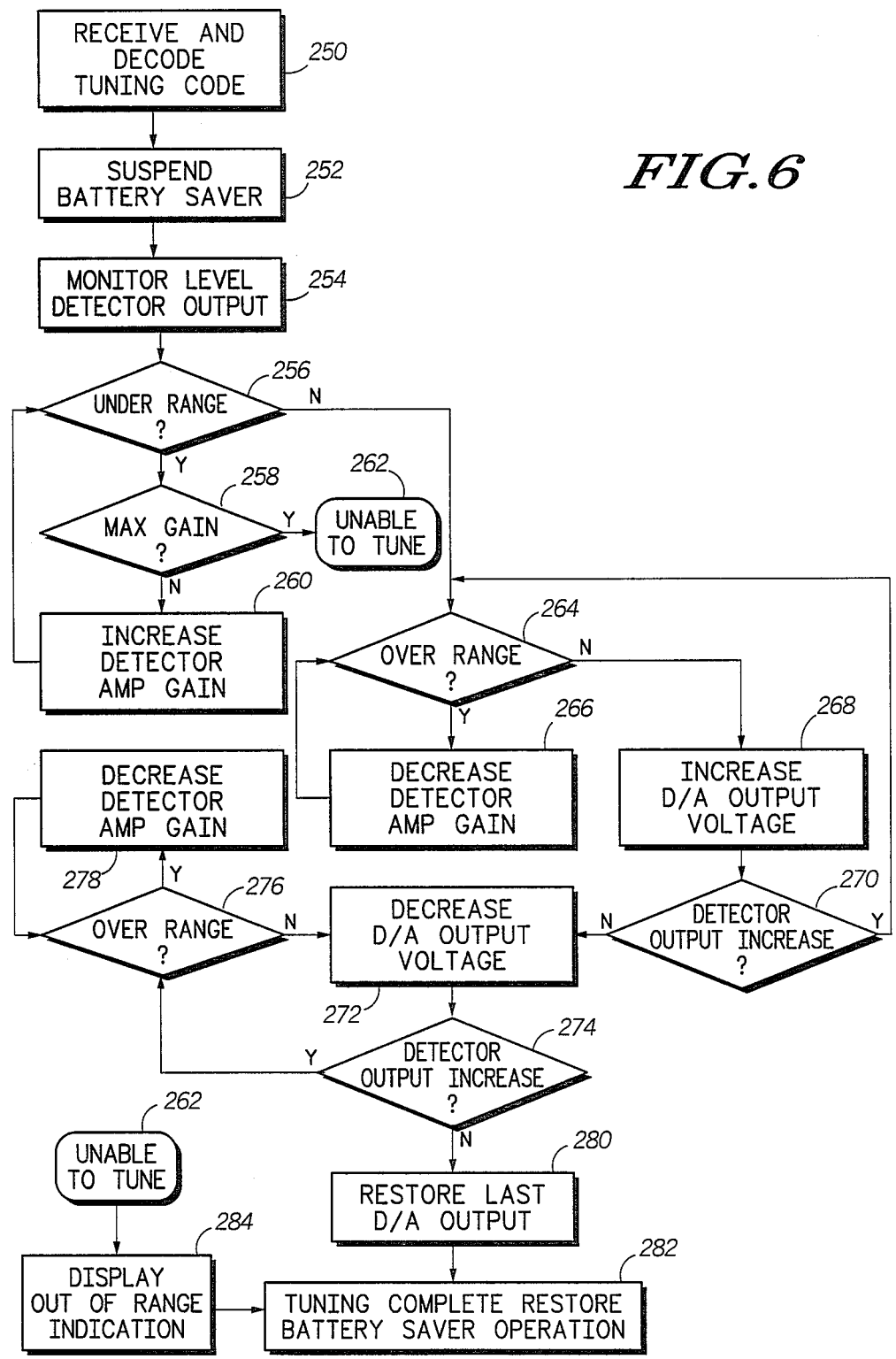
FIG. 6 is a flowchart describing the automatic antenna tuning of the present invention.

Reference is now directive to FIG. 6, a flow chart describing the procedure for automatically tuning antenna 14. When tuning is to be accomplished automatically, a unique selective call signal or code is transmitted to which all pager-watches configured for auto-tuning will respond as shown at block 250. When microprocessor 100 decodes the unique tuning code, the microprocessor 100 suspends normal paging functions and continuously enables the receiver 22 as shown at block 252. Immediately after the unique tuning code is transmitted, unmodulated carrier is transmitted for a period of time, such as two-tenths of a second which is the period of time to approximately transmit a single pager address. During this time, microcomputer 100 determines if it can adjust antenna 14 tuning by monitoring the output of level detector 46 as previously described as shown at block 254. Microcomputer 100 first checks to see if the signal strength is adequate for tuning by checking to see if level detector circuit 46 output is within the limits of response of the level detector circuit 46. If the signal received is low, indicated by an under-range condition as shown at block 256, microcomputer 100 first checks to see if amplifier 70 is set to maximum gain as shown at block 258. If amplifier 70 is not set to maximum gain, microcomputer 100 increases the gain as shown at block 260 and rechecks the under-range conditions as shown at block 256. This process will continue until the under-range condition has cleared as shown at block 256, or until maximum gain has been set on amplifier 70 as shown at block 258. If maximum gain is set as shown at block 258, and the under-range condition has not been cleared, the microcomputer 100 knows the signal strength is inadequate to attempt tuning antenna 14. Microcomputer 100 displays an out of range indication as shown at block 284, and restores normal functions and battery saver operation as shown at block 282. The out of range indication may also indicate a problem in antenna 14 or receiver 22, and repeated out of range indications would indicate a performance evaluation by a qualified service technician.

When the under-range condition has been cleared, microcomputer 100 checks for an over-range condition which may exist due to excessive signal strength, or excessive amplifier 70 gain as shown at block 264. If an over-range condition is detected by microcomputer 100, the gain of amplifier 70 is reduced as shown at block 266. The gain of amplifier 70 is reduced until the over-range condition is cleared as shown at block 264.

Once the level detector 46 is within range, microcomputer 100 increases the output 35 voltage from D/A 34 varying the capacitance of varactor diode 36 as shown at block 268. If the level detector 46 output indicates an increase in output as shown at block 270, microprocessor 100 checks to see that level detector 46 is not over-range as shown at block 264. Microcomputer 100 will continue to increase the D/A 204 voltage as long as level detector 46 indicates the output is increasing. When the output no longer increases as shown at block 270, microcomputer 100 decreases the D/A 34 output 35 as shown at block 272. If the level detector 46 output indicates an increase in level as shown at block 274, microcomputer 100 checks to see level detector 46 is not over-range as shown at block 276 and reduces the D/A 34 voltage as shown at block 272. If an over-range condition is detected at block 276, microcomputer 100 reduces the gain of amplifier 70 as shown at block 278 until the over-range condition is cleared as shown at block 276. Once level detector 46 shows no change in output indicating the peak has been detected as shown at block 274, microcomputer 100 restores the last A/D 34 voltage to varactor tuning diode 36 as shown at block 280. Microcomputer 100 restores normal functions and battery saver operation as shown at block 282 as the tuning process is complete.

The automatic antenna tuning function described may be initiated a number of times each day, thereby providing optimum sensitivity for such varying conditions, such as loosening of the wristband which may go unnoticed by the user, but which could cause a sensitivity degradation of as much as six to eight dB and more. With automatic antenna tuning provided, the system can compensate for variations in the antenna performance of the wrist worn pager-watch device.

We claim:

1. An antenna tuning apparatus for a portable communications device, the device including means for adapting the device to be worn on the body, and having a receiver for receiving transmitted signals including at least one tuning mode signal, said apparatus comprising:

antenna means for intercepting the transmitted signals;

antenna tuning means coupled to said antenna means for tuning the same;

receiver means, responsive to said antenna means, for receiving the transmitted signals to derive a carrier monitor signal, said receiver means further demodulating the transmitted signals to recover the tuning mode signal;

decoder means, responsive to the tuning mode signal, for generating a tuning mode detection signal;

carrier detection means, responsive to the carrier monitor signal, for generating a carrier magnitude signal;

tuning controller means, responsive to the tuning mode detection signal, for generating a tuning enable signal which is supplied to said carrier detection means for enabling the same;

said tuning controller means, further responsive to the carrier magnitude signal, for generating a tuning control signal; and converter means, responsive to the tuning control signal, for generating a tuning control voltage, the tuning control voltage being supplied to said antenna tuning means for effecting the tuning of said antenna means.

2. The antenna tuning apparatus according to claim 1 wherein the transmitted signals include at least one carrier signal, and the carrier monitor signal is derived from the carrier signal.

3. The antenna tuning apparatus according to claim 1 wherein the transmitted signals further include coded information signals, and the carrier monitor signal is derived from the coded information signals.

4. The antenna tuning apparatus according to claim 1 wherein said carrier detection means comprises:

amplifier means, responsive to said tuning controller means, for selectively amplifying the carrier monitor signal;

tuning detector means, responsive to the amplified carrier monitor signal, for generating the carrier magnitude signal; and selector means, responsive to the tuning enable signal, for providing the carrier monitor signal to said amplifier means.

5. The antenna tuning apparatus according to claim 4 wherein said selector means further controls the supply of power to said tuning detector means.

6. The antenna tuning apparatus according to claim 1 wherein said antenna means is located adjacent said means adapted for wearing on the body.

7. The antenna tuning apparatus according to claim 1 wherein said means adapted for wearing is removable from the housing.

8. The antenna tuning apparatus according to claim 1 wherein said carrier detection means further includes switch means, coupled to said selector means, for manually initiating the tuning of said antenna means.

9. The antenna tuning apparatus according to claim 1 wherein the tuning mode signal is included in coded sync signals which are periodically transmitted, and said decoder means is responsive to the coded sync signals for effecting the continued operation of the same, the coded sync signals including a first and a second coded sync signal, the second coded sync signal corresponding to the tuning mode signal and being transmitted in place of the first coded sync signal at a frequency substantially less than first coded sync signal, the second coded sync signal affecting the tuning of said antenna tuning means when the second coded sync signal is decoded.

10. An antenna tuning apparatus for a portable communications device, the device including means for adapting the device to be worn on the body, and having a receiver for receiving transmitted signals, including selective call signals, and at least one tuning mode signal, said apparatus comprising:

antenna means for intercepting the transmitted signals;

antenna tuning means coupled to said antenna means for tuning the same;

receiver means, responsive to said antenna means, for receiving the transmitted signals to derive a carrier monitor signal, said receiver means further demodulating the transmitted signals to recover the selective call signals and the tuning mode signal;

identification means for storing predetermined identification information;

decoder means, responsive to the selective call signals, for generating a first control signal when one of the selective call signals matches the predetermined identification information;

said decoder means, further responsive to the tuning mode signal, for generating a tuning mode detection signal when the tuning mode signal is decoded immediately after the first control signal is generated;

carrier detection means, responsive to the carrier monitor signal, for generating a carrier magnitude signal; and tuning controller means, responsive to the tuning mode detection signal, for generating a tuning enable signal, the tuning enable signal supplied to said carrier detection means for enabling the same;

said tuning controller means, further responsive to the carrier magnitude signal, for generating a tuning control signal; and converter means, responsive to the tuning control signal, for generating a tuning control voltage, the tuning control voltage being supplied to said antenna tuning means for effecting the tuning of said antenna means.

11. The antenna tuning apparatus according to claim 10 wherein the transmitted signals include at least one carrier signal and the carrier monitor signal is derived from the carrier signal.

12. The antenna tuning apparatus according to claim 10 wherein the carrier monitor signal is derived from the selective call signals.

13. The antenna tuning apparatus according to claim 10 wherein the transmitted signals includes an activation signal transmitted immediately after the tuning mode signal, and wherein:

said decoder means is responsive to the tuning mode signal, for generating a second control signal when the tuning mode signal is decoded immediately after the first control signal is generated; and said decoder means is further responsive to the activation signal, for generating a tuning mode detection signal when the activation signal is decoded immediately after the second control signal is generated.

14. The antenna tuning apparatus according to claim 10 wherein said carrier detection means comprises:

amplifier means, responsive to said tuning controller means, for selectively amplifying the carrier monitor signal;

tuning detector means, responsive to the amplified carrier monitor signal, for generating the carrier magnitude signal; and selector means, responsive to the tuning enable signal, for providing the carrier monitor signal to said amplifier means.

15. The antenna tuning apparatus according to claim 14 wherein said selector means further controls the supply of power to said tuning detector means.

16. The antenna tuning apparatus according to claim 10 wherein said antenna means is located adjacent said means adapted for wearing on the body.

17. The antenna tuning apparatus according to claim 10 wherein said means adapted for wearing is removable from the housing.

18. The antenna tuning apparatus according to claim 10 wherein said carrier detection means further includes switch means, coupled to said selector means, for manually initiating the tuning of said antenna means.

19. An antenna tuning apparatus for a portable communications device, the device including means for adapting the device to be worn on the body, and having a receiver for receiving transmitted signals including at least one tuning mode signal, said apparatus comprising:

antenna means for intercepting the transmitted signals;

antenna tuning means coupled to said antenna means for tuning the same;

receiver means, coupled to said antenna means, for receiving the transmitted signals to derive a carrier monitor signal, said receiver means further demodulating the transmitted signals to recover the tuning mode signal;

carrier detection means, responsive to the carrier monitor signal, for generating a carrier magnitude signal;

a microcomputer, coupled to said receiver means and to said carrier detection means, and responsive to the tuning mode signal for generating a tuning enable signal which is supplied to said carrier detection means for enabling the same, said microcomputer being further responsive to the carrier magnitude signal, for generating a tuning control signal; and converter means, coupled to said microcomputer and responsive to the tuning control signal, for generating a tuning control voltage, the tuning control voltage being supplied to said antenna tuning means for effecting the tuning of said antenna means.

20. The antenna tuning apparatus according to claim 19 wherein the transmitted signals include at least one carrier signal, and the carrier monitor signal is derived from the carrier signal.

21. The antenna tuning apparatus according to claim 19 wherein the transmitted signals further include coded information signals, and the carrier monitor signal is derived from the coded information signals.

22. The antenna tuning apparatus according to claim 19 wherein said carrier detection means comprises:
   amplifier means, responsive to said tuning controller means, for selectively amplifying the carrier monitor signal;
   tuning detector means, responsive to the amplified carrier monitor signal, for generating the carrier magnitude signal; and
   selector means, responsive to the tuning enable signal, for providing the carrier monitor signal to said amplifier means.

23. The antenna tuning apparatus according to claim 22 wherein said selector means further controls the supply of power to said tuning detector means.

24. The antenna tuning apparatus according to claim 19 wherein said antenna means is located adjacent said means adapted for wearing on the body.

25. The antenna tuning apparatus according to claim 19 wherein said means adapted for wearing is removable from the housing.

26. The antenna tuning apparatus according to claim 19 wherein said carrier detection means further includes switch means, coupled to said selector means, for manually initiating the tuning of said antenna means.

27. The antenna tuning apparatus according to claim 19 wherein the tuning mode signal is included in coded sync signals which are periodically transmitted, and said decoder means is responsive to the coded sync signals for effecting the continued operation of the same, the coded sync signals including a first and a second coded sync signal, the second coded sync signal corresponding to the tuning mode signal and being transmitted in place of the first coded sync signal at a frequency substantially less than first coded sync signal, the second coded sync signal affecting the tuning of said antenna tuning means when the second coded sync signal is decoded.

28. An antenna tuning apparatus for a portable communications device, the device including means for adapting the device to be worn on the body, and having a receiver for receiving transmitted signals, including selective call signals, and at least one tuning mode signal, said apparatus comprising:
   antenna means for intercepting the transmitted signals;
   antenna tuning means coupled to said antenna means for tuning the same;
   receiver means, coupled to said antenna means, for receiving the transmitted signals to derive a carrier monitor signal, said receiver means further demodulating the transmitted signals to recover the selective call signals and the tuning mode signal;
   identification means, for storing predetermined identification information;
   carrier detection means, responsive to the carrier monitor signal, for generating a carrier magnitude signal;
   a microcomputer, coupled to said receiver means, to said carrier detection means and to said identification means, and responsive to the tuning mode signal following a selective call signal matching the predetermined identification information, said microcomputer means,
   generating a tuning enable signal which is supplied to said carrier detection means for enabling the same, said microcomputer being further responsive to the carrier magnitude signal, for generating a tuning control signal; and
   converter means, coupled to said microcomputer and responsive to the tuning control signal, for generating a tuning control voltage, the tuning control voltage being supplied to said antenna tuning means for effecting the tuning of said antenna means.

29. The antenna tuning apparatus according to claim 28 wherein the transmitted signals include at least one carrier signal and the carrier monitor signal is derived from the carrier signal.

30. The antenna tuning apparatus according to claim 28 wherein the carrier monitor signal is derived from the selective call signals.

31. The antenna tuning apparatus according to claim 28 wherein the transmitted signals includes an activation signal transmitted immediately after the tuning mode signal, and wherein:
   said decoder means is responsive to the tuning mode signal, for generating a second control signal when the tuning mode signal is decoded immediately after the first control signal is generated; and
   said decoder means is further responsive to the activation signal, for generating a tuning mode detection signal when the activation signal is decoded immediately after the second control signal is generated.

32. The antenna tuning apparatus according to claim 28 wherein said carrier detection means comprises:
   amplifier means, responsive to said tuning controller means, for selectively amplifying the carrier monitor signal;
   tuning detector means, responsive to the amplified carrier monitor signal, for generating the carrier magnitude signal; and
   selector means, responsive to the tuning enable signal, for providing the carrier monitor signal to said amplifier means.

33. The antenna tuning apparatus according to claim 32 wherein said selector means further controls the supply of power to said tuning detector means.

34. The antenna tuning apparatus according to claim 28 wherein said antenna means is located adjacent said means adapted for wearing on the body.

35. The antenna tuning apparatus according to claim 28 wherein said means adapted for wearing is removable from the housing.

36. The antenna tuning apparatus according to claim 28 wherein said carrier detection means further includes switch means, coupled to said selector means, for manually initiating the tuning of said antenna means.

* * * * *